United States Patent
Shimizu

(10) Patent No.: US 8,227,739 B2
(45) Date of Patent: Jul. 24, 2012

(54) PHOTODETECTOR AMPLIFIER CIRCUIT FOR CONTROLLING AN ON STATE OR AN OFF STATE OF AN OUTPUT TRANSISTOR

(75) Inventor: Masafumi Shimizu, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 489 days.

(21) Appl. No.: 12/487,281

(22) Filed: Jun. 18, 2009

(65) Prior Publication Data

US 2010/0019131 A1    Jan. 28, 2010

(30) Foreign Application Priority Data

Jul. 24, 2008    (JP) .................................. 2008-191330

(51) Int. Cl.
*H03F 3/08* (2006.01)
*H01J 40/14* (2006.01)
*G02B 27/00* (2006.01)

(52) U.S. Cl. .................. 250/214 A; 250/551; 250/214 R
(58) Field of Classification Search .................. 250/221, 250/214 A, 214 R, 551, 214 SW, 205; 330/308; 348/300, 301; 398/202, 206, 209, 213; 327/514
See application file for complete search history.

(56) References Cited

U.S. PATENT DOCUMENTS

| | | | |
|---|---|---|---|
| 4,101,763 A * | 7/1978 | Flint et al. ................. | 250/214 R |
| 4,745,274 A * | 5/1988 | Muro ......................... | 250/214 R |
| 6,982,408 B2 * | 1/2006 | Maruyama .................... | 250/221 |
| 7,288,755 B1 * | 10/2007 | Fassbender et al. .......... | 250/221 |
| 2007/0096013 A1 * | 5/2007 | Sugimoto .................. | 250/214 A |

FOREIGN PATENT DOCUMENTS

JP         11-41036 A    2/1999
* cited by examiner

*Primary Examiner* — Pascal M Bui Pho
(74) *Attorney, Agent, or Firm* — Sughrue Mion, PLLC

(57) ABSTRACT

A photodetector amplifier circuit that converts a photodetector signal photoelectrically into a photocurrent and controls on or off state of an output transistor according to the photocurrent. The photodetector amplifier circuit has a first control circuit that is connected to a control terminal of the output transistor and controls on or off state of the output transistor according to the photocurrent and a switch that is connected between the control terminal of the output transistor and a ground voltage terminal and if the output transistor is turned off, discharges the control terminal of the output transistor by making the control terminal of the output transistor conductive with the ground voltage terminal.

11 Claims, 5 Drawing Sheets

PHOTODETECTOR AMPLIFIER CIRCUIT FOR CONTROLLING AN ON STATE OR AN OFF STATE OF AN OUTPUT TRANSISTOR

BACKGROUND

1. Field of the Invention

The present invention relates to a photodetector amplifier circuit.

2. Description of Related Art

FIG. 3 illustrates a circuit diagram of a photodetector amplifier circuit 1 disclosed in Japanese Unexamined Patent Application Publication No. 11-41036 as a known art. As shown in FIG. 3, the photodetector amplifier circuit 1 includes a photodiode PD1, amplifiers 2 and 3, and feedback resistors R1 to R4. The feedback resistor R1 is connected between an input and an output of the amplifier 2. The photodiode PD1 is connected between a power supply voltage terminal Vcc and the input of the amplifier 2. The feedback resistor R2 is connected between the output of amplifier 2 and an input of the amplifier 3. The feedback resistors R3 and R4, which are connected in series, are connected between the input and an output of the amplifier 3. An output terminal Vout1 is connected to the output of the amplifier 3.

The photodetector amplifier circuit 1 converts a photocurrent Ipd, which is an output current from the photodiode PD1, into a voltage by the feedback resistor R1 and the amplifier 2. Further, the photodetector amplifier circuit 1 amplifies the output voltage by a gain of (R3+R4)/R2 by the amplifier 3 and the feedback resistors R2 to R4. Then the photodetector amplifier circuit 1 outputs the amplified voltage to the output terminal Vout. For convenience, the above codes "VCC" and "Vout1" indicate the names of terminals as well as a power supply voltage and an output voltage, respectively. Further, the codes "R1" to "R4" indicate the names of resistance devices as well as their resistance values. Hereafter, codes of the terminals and resistance devices mentioned in this document also indicate voltages of the terminals and resistance values.

The abovementioned photodetector amplifier circuit 1 is mainly for photodetector ICs which are used as a pick-up in the field of storage such as CDs and DVDs. If the photodetector amplifier circuit 1 is used as a photocoupler, a high driving capability of the device in the subsequent stage device is required. Thus a base of an open collector output is connected to the output terminal Vout. This improves the driving capability.

An example of such circuit configuration as a photocoupler 10 is shown in FIG. 4. As shown in FIG. 4, the photocoupler 10 includes a light-emitting diode LED1, a photodetector amplifier circuit 1, a resistor R6, and an NPN transistor Q1. The photodetector amplifier circuit 1 has the same configuration as the one described above. It is noted that the resistors R3 and R4 are represented as a resistor R5. The output terminal Vout1 is referred to as a node F. The light-emitting diode LED1 is connected between signal input terminals Sin1 and Sin2. One end of the resistor R6 is connected to the node F. As for the NPN transistor Q1, a base is connected to the other end of the resistor R6, a collector is connected to an output terminal Vout2, and an emitter is connected to a ground voltage terminal GND. The NPN transistor Q1 has an open collector configuration. Thus, a pull-up resistor R7 is connected between the power supply voltage Vcc and the output terminal Vout2. The circuit of the above configuration is packaged as the photocoupler 10.

The operation of the photocoupler 10 is described hereinbelow. First, an electric signal is input to a primary light-emitting diode LED1 so that the light-emitting diode LED1 emits light. The photodiode PD1 of the second photodetector amplifier circuit 1 receives the emitted light to generate the photocurrent Ipd. The operation of the photodetector amplifier circuit 1 is as described above. The NPN transistor Q1 is driven according to a potential of the node F, which is an output of the photodetector amplifier circuit 1.

In response to an input of a signal to the light-emitting diode LED1, the potential level of the node F, which is the output of photodetector amplifier circuit 1, becomes high. This makes the NPN transistor Q1 turn on, which is connected to the node F via the resistor R6, turn on. Then the potential level of the output terminal Vout2 becomes low.

Conversely, if there is no signal input to the light-emitting diode LED1, the potential level of a node A, which is an output of the photodetector amplifier circuit 1, becomes low. This makes the NPN transistor Q1 turn off. The NPN transistor Q1 is connected to the node F via the resistor R6. Then the potential level of the output terminal Vout2 becomes high. By repeating such operation, signals input to the primary side are transmitted to the secondary side of the output terminal Vout2. Since the primary and the secondary side transmit signals via light, they are electrically insulated within the photocoupler 10.

FIG. 5 shows the circuit configuration of the common amplifier 3. As shown in FIG. 5, the amplifier 3 includes NPN transistors Q2 and Q3, and resistors R8 and R9. The resistor R8 and the NPN transistor Q2 are connected in series between the power supply voltage terminal Vcc and the ground voltage terminal GND. A base of the NPN transistor Q2 corresponds to the input of the amplifier 3. The NPN transistor Q3 and the resistor R9 are connected in series between the power supply voltage terminal Vcc and the ground voltage terminal GND. A base of the NPN transistor Q3 is connected to an intermediate node between the resistor R8 and the NPN transistor Q2. An intermediate node between the NPN transistor Q3 and the resistor R9 corresponds to the output of the amplifier 3. Accordingly, the NPN transistor Q3 has an emitter follower configuration. The operation of the amplifier is well known, thus the explanation is omitted here.

SUMMARY

The operation of the photocoupler 10 shown in FIG. 4 is described below when the output voltage Vout2 is low or high level. If the output voltage Vout2 is low-level, an emitter current from the NPN transistor Q3, which is on state, in the amplifier 3 flows through the resistor R6 to the base of the NPN transistor Q1, which is an output transistor. Accordingly, the NPN transistor Q1 is turned on. Conversely, if the output voltage Vout2 is high-level (i.e., if the NPN transistor Q1 is turned off), the NPN transistor Q3 is off state, and the emitter current from the NPN transistor Q3 does not flow. At this time, the base of the NPN transistor Q1 is low-level. This is achieved by discharging the charge of the base of the NPN transistor Q1 via the resistors R6 and R9.

In recent years, photocouplers are required to be faster and have high output. In order to increase the output, the size of the NPN transistor Q1, which is the output transistor, must be increased. However, the increase in the size of the NPN transistor Q1 also increases the discharging charge of the base in order to turn off the NPN transistor Q1. Thus, the inventor has found the problem that speeding up the photocoupler cannot be achieved only by discharging via the resistors R6 and R9, which is described above. Accordingly, increase in the speed and output of a photocoupler is incompatible.

An exemplary aspect of an embodiment of the present invention is a photodetector amplifier circuit that converts a photodetector signal photoelectrically into a photocurrent and controls on or off state of an output transistor according to the photocurrent. The photodetector amplifier circuit has a first control circuit that is connected to a control terminal of the output transistor and controls on or off state of the output transistor according to the photocurrent and a switch that is connected between the control terminal of the output transistor and a ground voltage terminal and if the output transistor is turned off, discharges the control terminal of the output transistor by making the control terminal of the output transistor conductive with the ground voltage terminal. In the photodetector amplifier circuit of the present invention, the control terminal of the output transistor and the ground voltage terminal are connected when the output transistor switches from on to off state and the charge is discharged quickly. This prevents from deteriorating the speed of switching from on to off state even if the size of the output transistor increases.

The present invention enables to increase the speed and the output of the photodetector amplifier circuit at the same time.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

Figure 1:
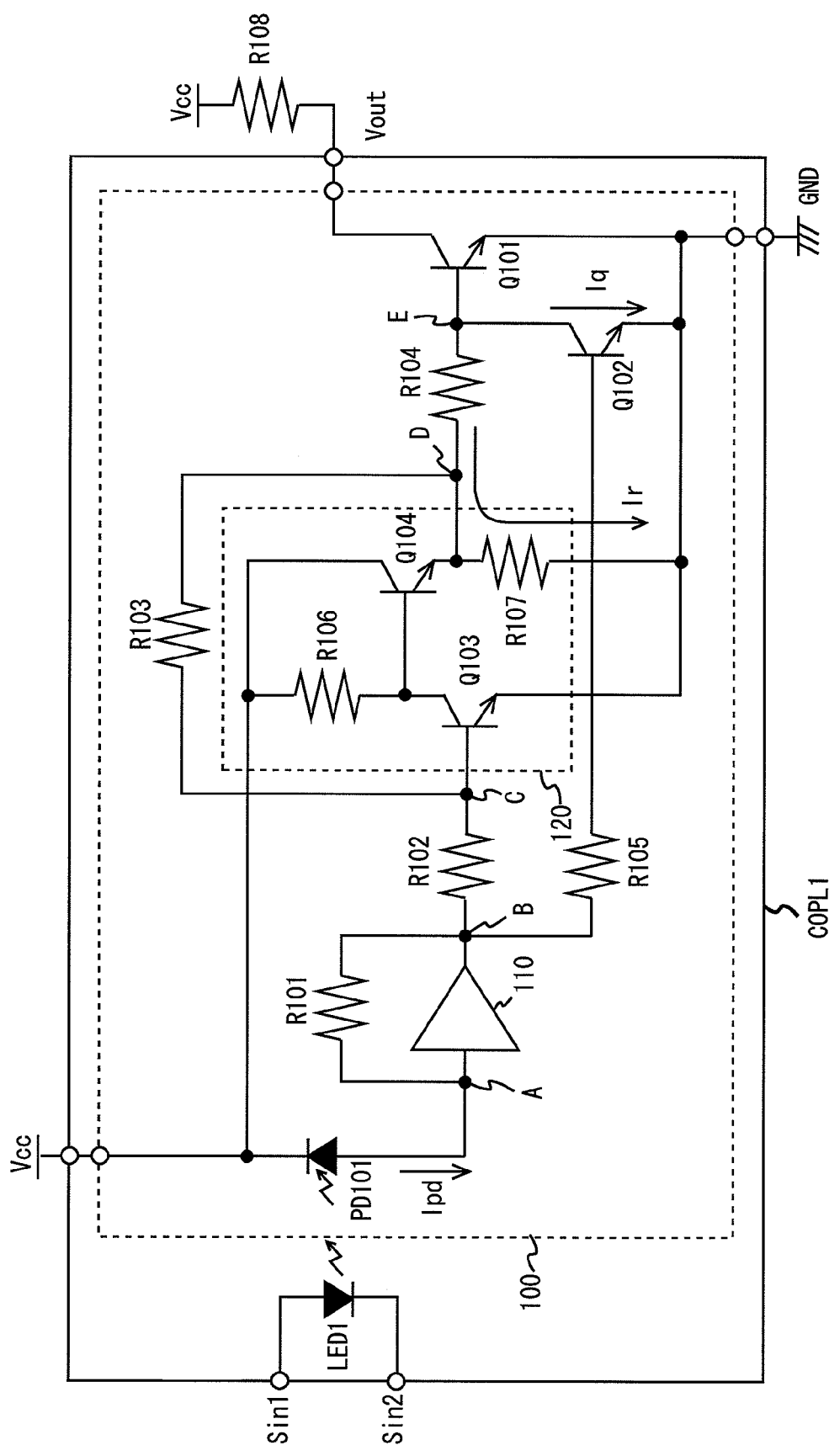
FIG. 1 illustrates an example of a configuration of a photocoupler including a photodetector amplifier circuit according to an exemplary embodiment of the present invention.

Hereafter, a specific exemplary embodiment incorporating the present invention is described in detail with reference to the drawings. This embodiment incorporates the present invention into a photodetector amplifier circuit of a photocoupler. The configuration of a photocoupler COPL1 of this embodiment is shown in FIG. 1. The photocoupler COPL1 includes a light-emitting device LED101 and a photodetector amplifier circuit 100. The light-emitting device LED101 and the photodetector amplifier circuit 100 are packaged together.

The light-emitting device LED101 is composed of a light-emitting diodes etc., and connected between signal input terminals Sin1 and Sin2. The light-emitting device LED101 emits light in response to an electric signal input to the signal input terminals Sin1 and Sin2. The light-emitting device LED101 transmits data to a photodetector device PD101 of the photodetector amplifier circuit 100 described later.

The photodetector amplifier circuit 100 receives a light from the light-emitting device LED101, converts the light photoelectrically and outputs as an electric signal again. As shown in FIG. 1, the photodetector amplifier circuit 100 includes a photodetector device PD101, amplifiers 110 and 120, resistance devices R101 to R105, and NPN transistors Q101 and Q102.

The photodetector device PD101 is composed of a photoelectric transducers, such as a photodiode or a phototransistor. In response to the light from the light-emitting device LED101, the photodetector device PD101 outputs a photocurrent Ipd. The photodetector device PD101 is connected between the power supply voltage terminal Vcc and the node A. The photocurrent Ipd is output to the node A.

As for the amplifier 110, an input is connected to the node A and an output is connected to the node B. As for the resistance device R101, one end is connected to the node A and the other end is connected to the node B. The resistance device R101 is a feedback resistor for the amplifier 110. The amplifier 110 and the resistance device R101 function as a current to voltage conversion circuit which converts the photocurrent Ipd from the photodetector device PD101 into a voltage. The circuit configuration of the amplifier 110 is the same as an amplifier 120, which is described later in detail.

As for the resistance device R102, one end is connected to the node B and the other end is connected to a node C. As for the amplifier 120, an input is connected to the node C and an output is connected to a node D. As for the resistance device R103, one end is connected to the node C and the other end is connected to the node D. The potential of the node B is amplified by the resistance devices R102 and R103 and the amplifier 120. The gain is R103/R102.

As shown in FIG. 1, the amplifier 120 includes NPN transistors Q103 and Q104, and resistance devices R106 and R107. The resistance device R106 and the NPN transistor Q103 are connected in series between the power supply voltage terminal Vcc and the ground voltage terminal GND. The base of the NPN transistor Q103, which is an input of the amplifier 120, is connected to the node C. The NPN transistor Q104 and the resistance device R107 are connected in series between the power supply voltage terminal Vcc and the ground voltage terminal GND. The base of the NPN transistor Q104 is connected to an intermediate node between the resistance device R106 and the NPN transistor Q103. An intermediate node between the NPN transistor Q104 and the resistance device R107, which is an output of the amplifier 120, is connected to the node D. As can be seen from FIG. 1, the NPN transistor Q104 has an emitter follower configuration.

As for the resistance device R104, one end is connected to the node D and the other end is connected to a node E. As for the NPN transistor Q101, which is an output transistor, a collector is connected to the output terminal Vout, an emitter is connected to the ground voltage terminal GND, and a base is connected to the node E. As for the resistance device R105, one end is connected to the node B and the other end is connected to the base of the NPN transistor Q102. As for the NPN transistor Q102, a collector is connected to the node E, an emitter is connected to the ground voltage terminal GND, and a base is connected to the other end of the resistance device R105. The NPN transistor Q101 has an open collector configuration in which a collector output is externalized. Accordingly, the output terminal Vout is connected to the power supply voltage terminal Vcc via the pull-up resistance device R108. It is noted that the output terminal Vout is a common output terminal for the photocoupler COPL1 and the photodetector amplifier circuit 100.

Figure 2:
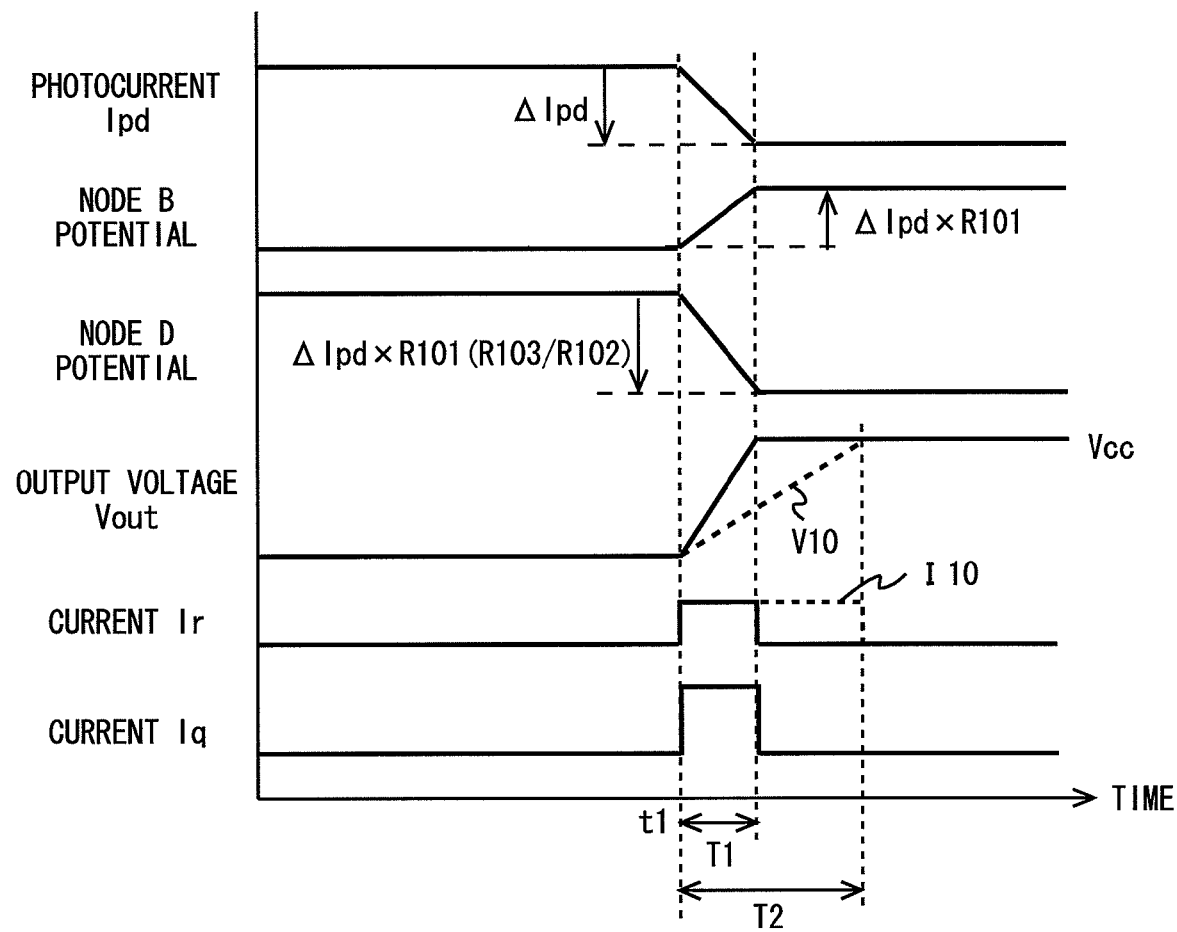
FIG. 2 illustrates an operation waveform diagram of the photodetector amplifier circuit according to the exemplary embodiment of the present invention.
Figure 3:
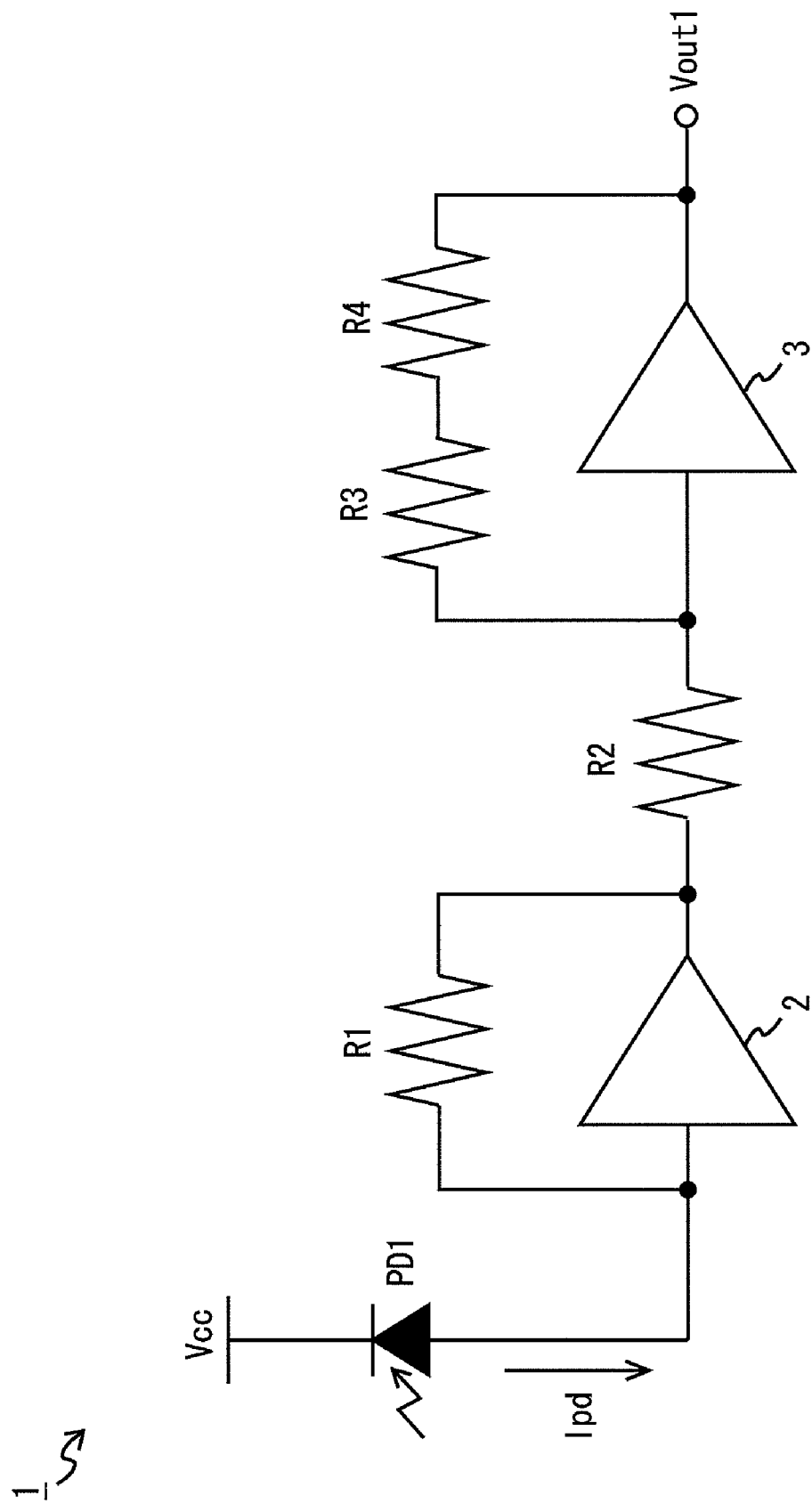
FIG. 3 illustrates a configuration of a circuit according to a related art.

It can be said that the amplifier 110 is a control circuit to control on and off state of the amplifier 120. Further, the amplifier 120 can be said to be a control circuit to control on and off state of the NPN transistor Q101 according to the output from the amplifier 110. It can be also said that the amplifiers 110 and 120 make up a control circuit to control on and off state of the NPN transistor Q101 according to the photocurrent Ipd from the photodetector device PD101. The operation of the photodetector amplifier circuit 100 of the abovementioned photocoupler COPL1 is described hereinafter in detail with reference to the drawings. The waveform of the operation of the photodetector amplifier circuit 100 is shown in FIG. 2. FIG. 2 illustrates potentials of the nodes B and D, the output terminal Vout, operating wavelengths of the photocurrent Ipd, a current Ir which flows the resistance devices R104 and R107, and a current Iq which flows the NPN transistor Q102.

Before the time t1, the photodetector device PD101 receives a light from the light-emitting device 101 and outputs the photocurrent Ipd to the node A. This state is hereinafter referred to as the case where a photocurrent waveform is high-level. Conversely, the case where a photocurrent waveform is low-level is that the photodetector device PD101 does not receive the light from the light-emitting device LED101 and barely outputs the photocurrent Ipd.

If the photocurrent waveform before the time t1 is high-level, the potential of the node B, which is an output from the current to voltage conversion circuit by the amplifier 110 and the resistance device R101, becomes low-level. Therefore, the potential of the node D, which is the output from the amplifier 120, becomes high-level. As the potential of the node B is low-level, the NPN transistor Q102 is off state. Further, as the potential of the node D is high-level, meaning that the NPN transistor Q104 of the amplifier 120 is on state, an emitter current flows to the base of the transistor Q101, which is the output transistor, via the resistance R104. Accordingly, the transistor Q101 becomes on state. This makes the output terminal Vout be conductive with the ground voltage terminal GND, thereby setting the output voltage Vout to the ground voltage GND.

Next, at the time t1, the photocurrent Ipd decreases by the current value ΔIpd and the photocurrent waveform changes from high-level to low-level. In this case, the potential of the node B, which is the output from the current to voltage conversion circuit by the amplifier 110 and the resistance device R101, changes from low-level to high-level. The potential of the node B increases by the potential difference of ΔIpd× R101. Further, the potential of the node D, which is the output of the amplifier 120, changes from high-level to low-level. As the potential difference of ΔIpd×R101 is multiplied by (R103/R102) and decreases, the potential of the node D decreases by ΔIpd×R101×(R103/R102).

As described so far, a fall of the potential of the node D reduces the base potential of the NPN transistor Q101. Accordingly, the NPN transistor Q101 is cut off, thereby blocking the ground voltage terminal GND and the output terminal Vout. Therefore, the potential of the output terminal Vout increases to high-level, meaning that the output voltage Vout becomes the power supply voltage Vcc.

At the same time as the above operation, the node B becomes high-level. Thus the NPN transistor Q102 becomes on state. Then the node E and the ground voltage terminal GND become conductive and the current Iq flows to the NPN transistor Q102. Thus, the charge of the base of the NPN transistor Q101 is discharged via the NPN transistor Q102. The charge of the base of NPN transistor Q101 is also discharged by the current Ir which flows through the resistance devices R104 and R107. By discharging the charge of the base of the NPN transistor Q101 by the currents Iq and Ir, the NPN transistor Q101 can be off state quickly. The discharging period at this time is referred to as T1. It is noted that the resistance device R105 serves to prevent from delaying the NPN transistor Q101 to be on state when the NPN transistor Q102 is strongly saturated and delayed to switch from on to off state.

As described above, the photodetector amplifier circuit 100 of this embodiment has the NPN transistor Q102 located between the base of the NPN transistor Q101, which is the output transistor, and the ground voltage terminal GND. When the NPN transistor Q101 turns off, the NPN transistor Q102 is turned on so as to actively discharge the charge of the base of the NPN transistor Q101. The charge of the base of the NPN transistor Q101 is also discharged via the resistance devices R104 and R107.

Figure 4:
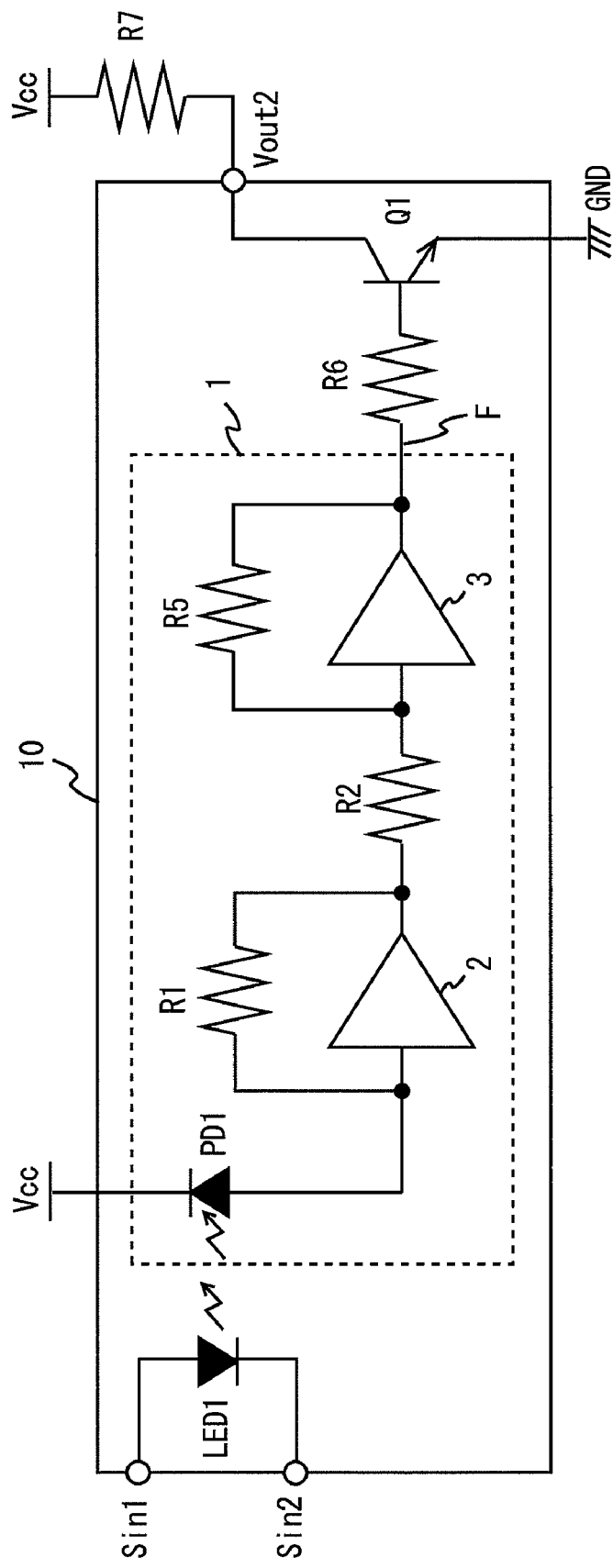
FIG. 4 illustrates a configuration of a photocoupler according to the related art.
Figure 5:
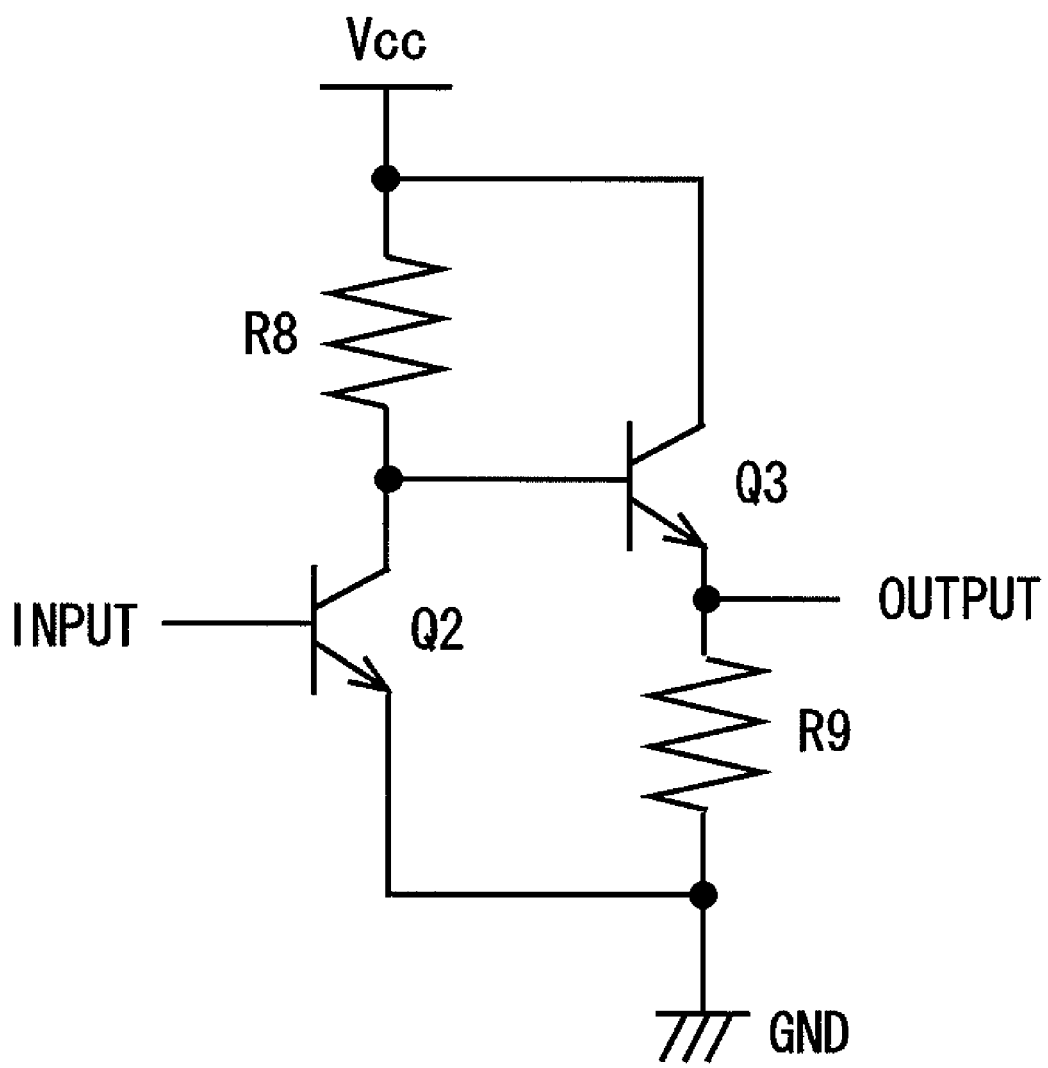
FIG. 5 is a configuration of a circuit of a common amplifier.

In the circuit configuration of the related art shown in FIG. 4, the charge of the base of the NPN transistor Q1, which is the output transistor, is discharged by a current via the resistors R5 and R9. Therefore, the discharge period of the charge of the base of the NPN transistor Q1 varies according to the time constant, which is determined by the base capacitance and the resistors R6 and R9. Thus, the larger the size of the NPN transistor Q1, the larger the base capacitance and the longer the discharge period. In order to compare the circuit of the related art with the photodetector amplifier circuit 100 of this embodiment, an output voltage and a discharging charge via the resistance devices in the circuit configuration of the related art which does not include the transistor for discharging the base charge are respectively referred to as V10 and I10, which are illustrated as chained lines in FIG. 2. Further, the discharge period is referred to as a period T2 in FIG. 2.

On the other hand, as mentioned above, in the photodetector amplifier circuit 100 of this embodiment, the charge of the base of the NPN transistor Q101 is discharged by the currents Iq and Ir that flow the NPN transistor Q102 and the resistance devices R104 and R107. Therefore, the discharge speed of the charge of the base increases, thereby completing the discharge in the period T1, which is shorter than the period T2. Accordingly, even with the increase in the size of the NPN transistor Q101, which is the output transistor, the operation of turning off the NPN transistor Q101 can be speed up. This consequently achieves to increase the output and speed up of the photocoupler COPL1 at the same time. Then the incompatible problem of the higher output and speed of the photocoupler of the related art can be solved.

The present invention is not limited to the above embodiments, but may be modified and changed without departing from the scope and spirit of the invention. For example, this embodiment is explained with the circuit using the NPN transistors Q101 to Q104. However the circuit may be realized using PNP transistors instead of the NPN transistors. However, in such case, the circuit configuration is changed so as to improve to charge the base of the output transistor, instead of improving to discharge the charge of the base of the output transistor. Thus, the collector of the output transistor, which is an output terminal, is connected to the ground potential side. Further, a PNP transistor (which corresponds to the NPN transistor Q102) for charging the base is connected between the base and the power supply voltage VDD. Moreover, a MOS transistor or a switch of other configuration may be responsible for discharging the base charge of the output transistor, instead of the NPN transistor Q102, which is a bipolar transistor.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A photodetector amplifier circuit that converts a photodetector signal photoelectrically into a photocurrent and controls an on state or an off state of an output transistor according to the photocurrent, the photodetector amplifier circuit comprising:
   a first control circuit that is connected to a control terminal of the output transistor and controls the on state or the off state of the output transistor according to the photocurrent; and
   a switch that is connected between the control terminal of the output transistor and a ground voltage terminal and if the output transistor is turned off, discharges the control terminal of the output transistor by making the control terminal of the output transistor conductive with the ground voltage terminal,
   a first resistance device connected between a second control circuit and a control terminal of a second transistor,
   wherein the first control circuit comprises the second control circuit and a third control circuit, and the switch is made up of the second transistor.

2. The photodetector amplifier circuit according to claim 1, wherein the output transistor is an open collector.

3. The photodetector amplifier circuit according to claim 1, wherein
   the second control circuit converts the photocurrent into a voltage, and
   the third control circuit controls the on state or the off state of the output transistor according to an output from the first control circuit.

4. The photodetector amplifier circuit according to claim 3, wherein the switch is controlled according to an output from the second control circuit.

5. The photodetector amplifier circuit according to claim 3, wherein
   if the output transistor is in the on state, the third control circuit connects a power supply voltage terminal to the control terminal of the output transistor, and
   if the output transistor is in the off state, the third control circuit blocks the power supply voltage terminal and the control terminal of the output transistor to control the on state or the off state of the output transistor.

6. The photodetector amplifier circuit according to claim 5, wherein
   the third control circuit comprises a first transistor and a second resistance device that are connected in series between the power supply voltage terminal and the ground voltage terminal,
   an intermediate node between the first transistor and the second resistance device is connected to the control terminal of the output transistor,
   if the output transistor is in the on state, the third control circuit turns on the first transistor so as to connect the second power supply voltage terminal to the control terminal of the output transistor, and
   if the output transistor is in the off state, the third control circuit turns off the first transistor so as to block the power supply voltage terminal and the control terminal of the output transistor.

7. The photodetector amplifier circuit according to claim 3, wherein
   the control terminal of the second transistor is connected to the second control circuit.

8. The photodetector amplifier circuit according to claim 1, wherein the photodetector amplifier circuit is used in a photocoupler.

9. The photodetector amplifier circuit according to claim 1, wherein the second control circuit comprises an amplifier connected between an output of the second control circuit and a photodiode, the amplifier controlling an on state and an off state of the third control circuit.

10. The photodetector amplifier circuit according to claim 1, wherein the second transistor and the output transistor are npn transistors.

11. The photodetector amplifier circuit according to claim 1, wherein the second transistor and the output transistor are pnp transistors.

* * * * *